(12) United States Patent
Shibasaki

(10) Patent No.: US 6,556,439 B2
(45) Date of Patent: Apr. 29, 2003

(54) COOLING UNIT FOR COOLING HEAT GENERATING COMPONENT AND ELECTRONIC APPARATUS EQUIPPED WITH THE COOLING UNIT

(75) Inventor: Kazuya Shibasaki, Hamura (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/892,570

(22) Filed: Jun. 28, 2001

(65) Prior Publication Data

US 2002/0001176 A1 Jan. 3, 2002

(30) Foreign Application Priority Data

Jun. 29, 2000 (JP) ........................................ 2000-196864

(51) Int. Cl.[7] ................................................ G06F 1/20
(52) U.S. Cl. ...................... 361/687; 361/704; 165/80.2; 174/15.1
(58) Field of Search ................................. 361/687, 699, 361/700, 704, 709, 710, 695–698; 165/80.4, 80.2, 80.3, 185; 174/15.2, 16.3, 15.1

(56) References Cited

U.S. PATENT DOCUMENTS

| | | |
|---|---|---|
| 296,083 A | 1/1997 | TWX |
| 310,388 A | 7/1997 | TWX |
| 387,582 A | 4/2000 | TWX |
| 6,166,907 A * | 12/2000 | Chien .......................... 361/699 |
| 6,250,378 B1 * | 6/2001 | Kobayashi ............. 165/104.33 |
| 6,341,062 B1 * | 1/2002 | Patel .......................... 361/687 |

OTHER PUBLICATIONS

Taiwan Office Action dated Oct. 23, 2002, and English translation thereof.

* cited by examiner

Primary Examiner—Darren Schuberg
Assistant Examiner—Hung Van Duong
(74) Attorney, Agent, or Firm—Finnegan, Henderson, Farabow, Garrett & Dunner, L.L.P.

(57) ABSTRACT

A cooling unit comprises a heat receiving head provided in a main body, and a radiator provided in a display unit. The display unit is pivotably supported by the main body using a hinge shaft. The heat receiving head is thermally connected to a heat generating component incorporated in the main body. The heat receiving head is connected to the radiator via a circulation line for circulating cooling medium. The circulation line includes a bending-force-absorbing section having a shape that is deformable to twist about an axis of the hinge shaft when the display unit is pivoted.

19 Claims, 6 Drawing Sheets

COOLING UNIT FOR COOLING HEAT GENERATING COMPONENT AND ELECTRONIC APPARATUS EQUIPPED WITH THE COOLING UNIT

CROSS-REFERENCE TO RELATED APPLICATIONS

This application is based upon and claims the benefit of priority from the prior Japanese Patent Application No. 2000-196864, filed Jun. 29, 2000, the entire contents of which are incorporated herein by reference.

BACKGROUND OF THE INVENTION

The present invention relates to a cooling unit for accelerating the dissipation of heat generated from a heat generating component such as a semiconductor package, and an electronic apparatus equipped with the cooling unit.

Various types of portable electronic apparatuses, represented by notebook-sized portable computers or mobile information apparatuses, have recently become available. These electronic apparatuses incorporate an MPU (Micro Processing Unit) for processing multimedia information such as characters, voice and animation, etc. In accordance with the increase in processing speed or the enhancement of functionality, the power consumption of the MPU continues to increase. In proportion to this increase, the amount of heat generated during the operation of the MPU is also increasing. Accordingly, it is necessary to increase the degree of heat dissipation of the MPU in order to secure stable operation. To this end, various types of heat-dissipating/cooling means such as a heat sink and a heat pipe, etc. are indispensable.

A portable computer equipped with an MPU of a high heat release value generally has a heat sink on a circuit board that is provided with the MPU mounted thereon. The heat sink is thermally connected to the MPU via a heat pipe or a heat conduction sheet. Cooling air is forcibly supplied to the heat sink, using an electric fan.

In this conventional cooling system, cooling air is the medium that absorbs the heat of the MPU, which means that the ability to cool the MPU mainly depends upon the blowing performance of the electric fan. However, an increase in the amount of cooling air involves an increase in the rotational speed of the electric fan and hence an increase in the noise of the fan. Furthermore, since, in portable computers, housings containing the MPU or the electric fan are designed to be thin and compact, they are not big enough to house a large, high blowing performance electric fan, or to secure an ideal air passage.

In the near future, MPUs for portable computers are expected to consume greater amounts of power, and accordingly the amount of heat generated is expected to rise remarkably. In light of this, it is very possible that the cooling performance of the conventional forcible air cooling system will be insufficient, or will reach its limits.

To avoid this, a cooling system is attempted, which utilizes so-called liquid cooling, in order to enhance the efficiency of cooling the MPU, wherein a liquid having a much higher specific heat than air is used as a heat transfer medium (cooling medium).

In this new cooling system, a heat receiving head thermally connected to the MPU is located in the housing, and a heat dissipation plate is located in a display unit supported by the housing. The heat receiving head and the heat dissipation plate are connected to each other by means of a liquid-circulating pipe.

In this cooling system, since a liquid is circulated between the heat receiving head and the heat dissipation plate, the heat of the MPU is transferred to the heat receiving head, and then to the heat dissipation plate by means of the liquid. The heat transferred to the heat dissipation plate is dissipated to the air as a result of heat diffusion due to heat conduction to the display unit. Accordingly, the cooling system utilizing liquid cooling can more efficiently transfer the heat of the MPU to the display unit than the conventional cooling system utilizing forcible air cooling. Thus, the performance of cooling the MPU is enhanced and no problems occur in terms of noise.

In the cooling system utilizing liquid cooling, the heat dissipation plate is installed in the display unit and not in the housing. Therefore, a circulation pipe for flowing the liquid therethrough must be provided between the display unit and the housing.

The housing supports the display unit such that the unit can pivot between its closure position in which it covers the upper surface of the housing, and its open position in which the upper surface of the housing is exposed. Accordingly, each time the display unit is pivoted, stress created by the pivoting operation of the display unit concentrates, in particular, on the portion of the circulation pipe, which is located between the housing and the display unit. As a result, it is possible that this portion will be damaged.

The damage of the circulation pipe may lead to leakage of the liquid into the housing or the display unit, thereby causing the circuit board to short-circuit. In light of the typical manner of use of portable computers, this is the primary problem to be solved.

BRIEF SUMMARY OF THE INVENTION

It is the object of the present invention to provide a cooling unit and an electronic apparatus including the cooling unit, in which the stress applied to circulation means when pivoting its display unit is reduced to an allowable level, and hence which is free from damage of the circulation means and leakage of coolant due to the damage.

To attain the object, according to a first aspect of the invention, there is provided a cooling unit for use in an electronic apparatus including a main body having a heat generating component, and a display unit pivotably supported by the main body using a hinge shaft, comprising: heat receiving means provided in the main body and thermally connected to the heat generating component; heat exchange means provided in the display unit; and circulation means for circulating cooling medium between the heat receiving means and the heat exchange means, the circulation means including a bending-force-absorbing section having a shape that is deformable to twist about an axis of the hinge shaft when the display unit is pivoted.

According to a second aspect of the invention, there is provided an electronic apparatus comprising: a main body having a heat generating component; a display unit pivotably supported by the main body using a hinge shaft; heat receiving means provided in the main body and thermally connected to the heat generating component; heat exchange means provided in the display unit; and circulation means for circulating cooling medium between the heat receiving means and the heat exchange means, the circulation means including a bending-force-absorbing section having a shape that is deformable to twist about an axis of the hinge shaft when the display unit is pivoted, the bending-forceabsorbing section being located along an extended line of the axis of the hinge shaft.

In the above-described structure, the heat of the heat generating component is transferred from the heat receiving means to cooling medium. In accordance with the flow of cooling medium, the heat is transferred to the heat exchange means, where it is discharged to the atmosphere as a result of heat exchange. Cooling medium cooled by the heat exchange means is returned to the heat receiving means via the circulation means, where it again receives heat generated by the heat generating component. The repetition of this cycle enables the heat of the heat generating component to be efficiently discharged from the display unit to the atmosphere.

When the display unit is pivoted on the hinge shaft, the bending-force-absorbing section of the circulation means smoothly twists to thereby absorb a bending force applied to the circulation means during the pivoting operation. Accordingly, concentration of stress on a particular portion of the circulation means is avoided, whereby the stress on the circulation means can be reduced to an allowable value.

According to a third aspect of the invention, there is provided an electronic apparatus comprising: a main body having a heat generating component; a display unit pivotably supported by the main body using a hinge shaft; heat receiving means provided in the main body and thermally connected to the heat generating component; heat exchange means provided in the display unit; and circulation means for circulating cooling medium between the heat receiving means and the heat exchange means, the circulation means including a first heat transfer pipe for guiding, to the heat exchange means, cooling medium heated by heat conducted from the heat receiving means, and a second heat transfer pipe for guiding, to the heat receiving means, cooling medium cooled by the heat exchange means, the first and second heat transfer pipes including respective twistable bending-force-absorbing sections having a plurality of loops that are formed by coiling the first and second heat transfer pipes about an axis of the hinge shaft, the bending-force-absorbing sections of the first and second heat transfer pipes being coaxial so that the loops are engaged with the loops along an extended line of the axis of the hinge shaft.

In the above-described structure, the heat of the heat generating component is transferred from the heat receiving means to cooling medium. In accordance with the flow of cooling medium, the heat is transferred to the heat exchange means, where it is discharged to the atmosphere as a result of heat exchange. Cooling medium cooled by the heat exchange means is returned to the heat receiving means via the second heat transfer pipe, where it again receives heat generated by the heat generating component. The repetition of this cycle enables the heat of the heat generating component to be efficiently discharged from the display unit to the atmosphere.

When the display unit is pivoted on the hinge shaft, the bending-force-absorbing sections of the first and second heat transfer pipes smoothly twist to thereby absorb a bending force applied to the pipes. More specifically, the bending-force-absorbing sections have a plurality of loops formed by coiling the pipes about an extended line of the axis of the hinge shaft. When a bending force is applied to the bending-force-absorbing sections, the loops deform in a direction in which they are tightly wound, or in a direction in which they are loosely wound, thereby absorbing the bending force. As a result, concentration of stress on a particular portion of the first or second heat transfer pipe is avoided, whereby the stress on the pipes can be reduced to an allowable value.

Furthermore, since the bending-force-absorbing sections of the first and second heat transfer pipes are reliably meshed with each other, they will not be separated. Accordingly, the bending-force-absorbing sections can be formed compact at middle portions of the first and second heat transfer pipes. This means that it is not necessary to secure a wide space for individually containing the bending-force-absorbing sections of the first and second heat transfer pipes.

According to a fourth aspect of the invention, there is provided an electronic apparatus comprising: a main body having a heat generating component; a display unit pivotably supported by the main body using a hinge shaft; heat receiving means provided in the main body and thermally connected to the heat generating component; heat exchange means provided in the display unit; and circulation means for circulating cooling medium between the heat receiving means and the heat exchange means, the circulation means including an elastically-deformable hollow bending-force-absorbing section coaxial with an axis of the hinge shaft, the bending-force-absorbing section having a first passage for guiding, to the heat exchange means, cooling medium heated by heat conducted from the heat receiving means, and a second passage for guiding, to the heat receiving means, cooling medium cooled by the heat exchange means.

In the above-described structure, the heat of the heat generating component is transferred from the heat receiving means to cooling medium. In accordance with the flow of cooling medium, the heat is transferred to the heat exchange means, where it is discharged to the atmosphere as a result of heat exchange. Cooling medium cooled by the heat exchange means is returned to the heat receiving means via the circulation means, where it again receives heat generated by the heat generating component. The repetition of this cycle enables the heat of the heat generating component to be efficiently discharged from the display unit to the atmosphere.

When the display unit is pivoted on the hinge shaft, the bending-force-absorbing section of the circulation means smoothly twists to thereby absorb a bending force applied to the circulation means during the pivoting operation. Since the hollow bending-force-absorbing section is located in the axial direction of the hinge shaft, it easily twists about an extended line of the axis of the hinge shaft. Therefore, when a bending force is applied to the bending-force-absorbing section, this section smoothly twists to thereby absorb the bending force applied to the circulation means. As a result, concentration of stress on a particular portion of the circulation means is avoided, whereby the stress on the circulation means can be reduced to an allowable value.

Moreover, in the above structure, the bending-force-absorbing section includes a first passage for guiding heated cooling medium to the heat exchange means, and a second passage for guiding cooled cooling medium to the heat receiving means. Therefore, it is sufficient if the bending-force-absorbing section is provided at one location in the cooling medium circulation line, which makes it unnecessary to secure a wide space in the main body or the display unit for containing the bending-force-absorbing section.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

A portable computer according to a first embodiment of the invention will be described with reference to FIGS. 1–7.

Figure 1:
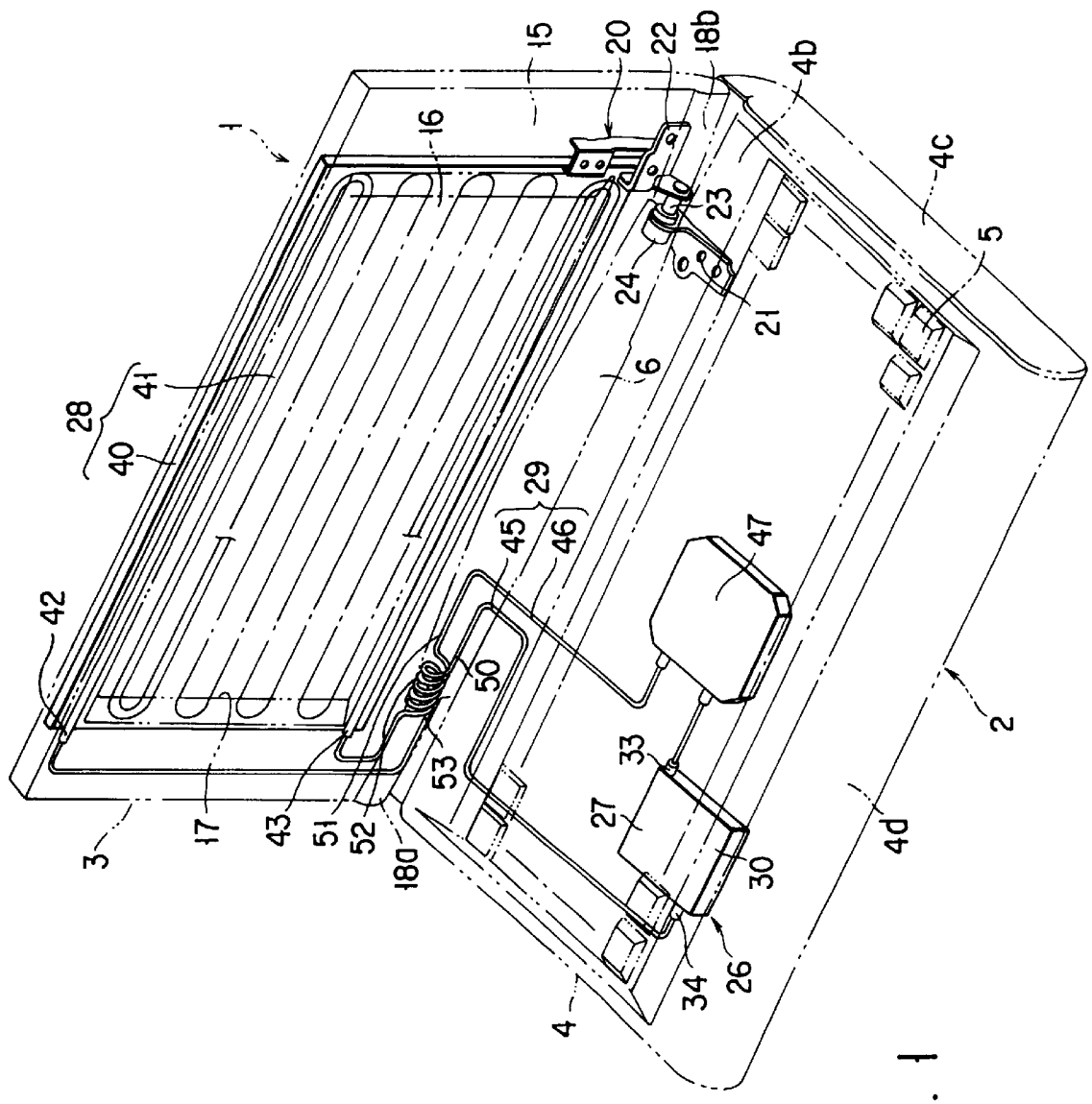
FIG. 1 is a perspective view illustrating a portable computer having a cooling unit utilizing liquid cooling, according to a first embodiment of the invention.
Figure 2:
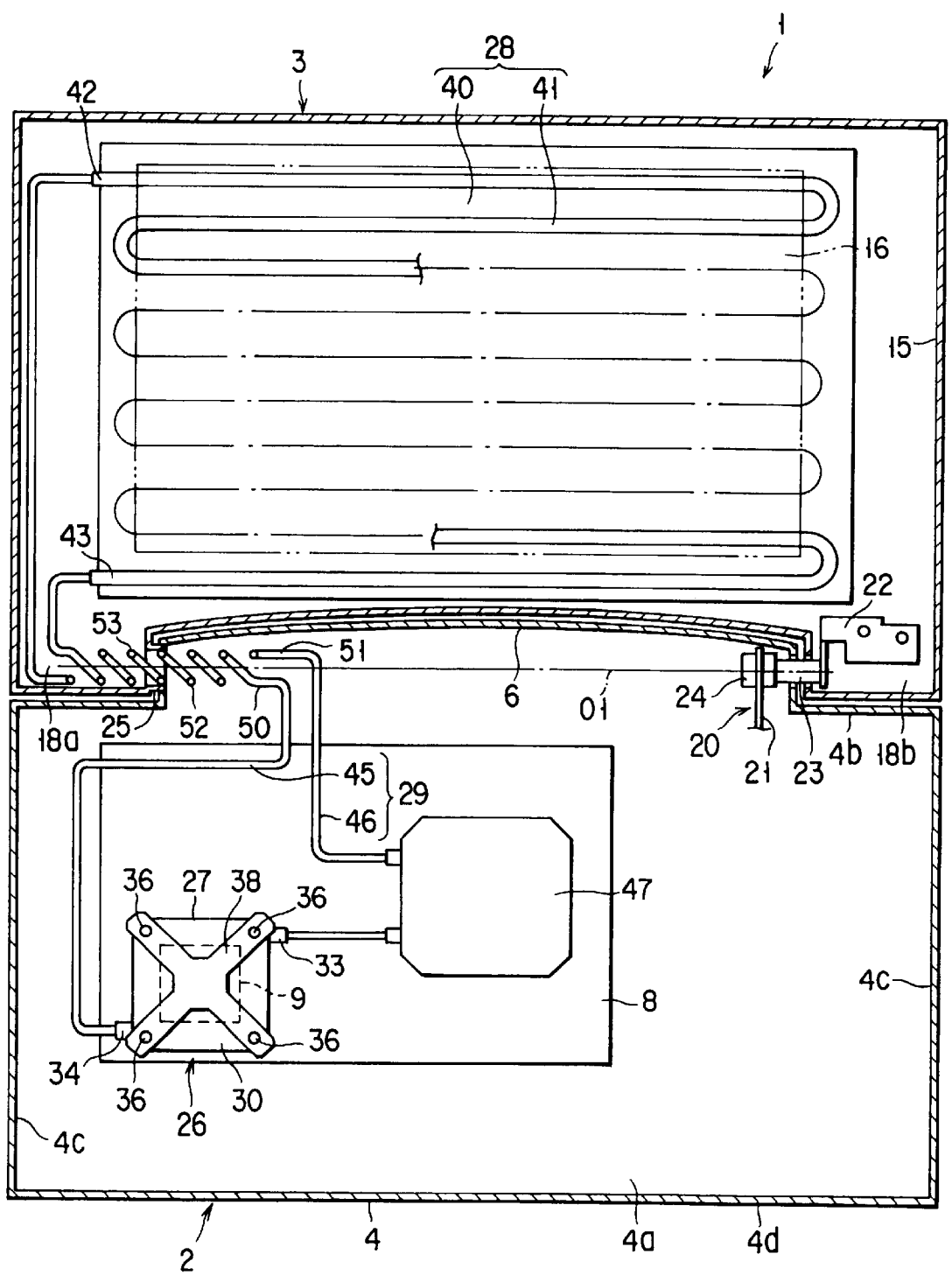
FIG. 2 is a schematic sectional view of the portable computer, illustrating a state in which the cooling unit utilizing liquid cooling is incorporated in its computer main body and display unit.

FIGS. 1 and 2 show a portable computer 1 as an electronic apparatus. The portable computer 1 includes a computer main body 2 as an apparatus main body, and a display unit 3 supported by the computer main body 2.

The computer main body 2 has a box-shaped housing 4. The housing 4 has a bottom wall 4a, an upper wall 4b, left and right-hand walls 4c and a front wall 4d. A keyboard 5 is provided on the upper wall 4b. An upwardly projecting hollow projection 6 is provided on a rear end portion of the upper wall 4b. The projection 6 extends behind the keyboard 5 along the length of the housing 4. The projection 6 has opposite ends thereof located inside the side walls 4c of the housing 4 along the length of the housing 4.

Figure 3:
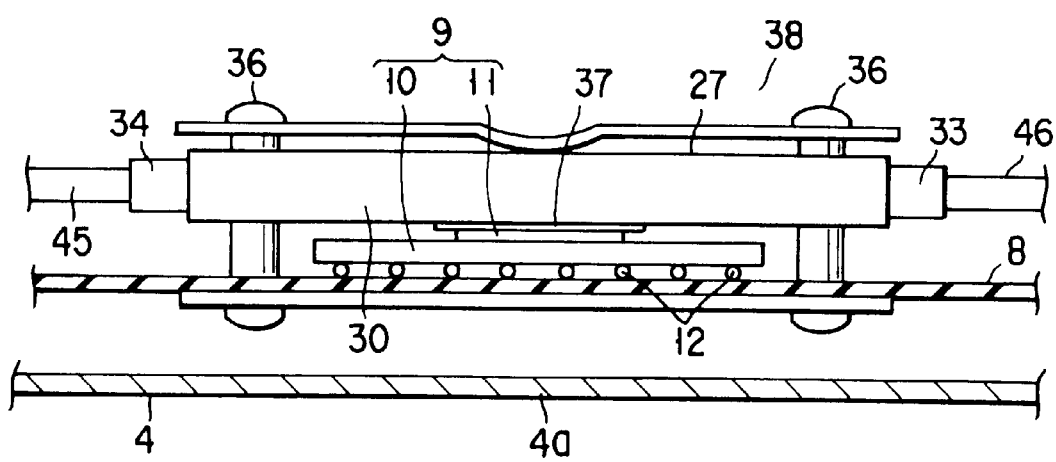
FIG. 3 is a sectional view illustrating the positional relationship between a heat receiving head and a semiconductor package.

As shown in FIGS. 2 and 3, a circuit board 8 is contained in the housing 4. The circuit board 8 is located in parallel with the bottom wall 4a of the housing 4. A semiconductor package 9 in the form of a BGA, serving as a heat generating component, is mounted on the upper surface of the circuit board 8.

The semiconductor package 9 constitutes an MPU (Micro Processing Unit) as the nerve center of the portable computer 1. The semiconductor package 9 includes a rectangular base plate 10, and an IC chip 11 soldered on the upper surface of the base plate 10. The base plate 10 is soldered on the upper surface of the circuit board 8 with a large number of solder balls 12 interposed therebetween. The semiconductor package 9 constructed as above consumes a large amount of power during its operation since it has a high processing speed and enhanced functionality. Accordingly, the amount of heat generated by the IC chip 11 is so large that the IC chip 11 must be cooled.

The display unit 3 comprises a display housing 15 and a liquid crystal display panel 16 received in the display housing 15. The display housing 15 is made of a metal having a high heat conductivity, such as a magnesium alloy, and is in the shape of a flat box that has an opening 17 for display formed in its front surface. The liquid crystal display panel 16 has a display screen (not shown) for displaying information such as characters or images. This display screen is exposed through the opening 17 to the outside of the display housing 15.

As shown in FIGS. 1 and 2, the display housing 15 has a pair of leg sections 18a and 18b projecting from its one side. The leg sections 18a and 18b are separate from each other along the length of the display housing 15. The projection 6 of the housing 4 is situated between the leg sections 18a and 18b. Thus, the leg section 18a and 18b have their respective side faces opposed to the opposite ends of the projection 6.

A rear end portion of the housing 4 supports the display unit 3 by means of a hinge device 20, so that the unit 3 can pivot. The hinge device 20 includes first and second brackets 21 and 22 and a hinge shaft 23.

The first bracket 21 is screwed to the bottom wall 4a of the housing 4, and has its one end guided to the inside of a right end portion of the projection 6. The second bracket 22 is screwed to the inner surface of the display housing 15, and has its one end guided to the inside of the right-hand leg section 18b of the display housing 15. The hinge shaft 23 is interposed between the one end portions of the first and second brackets 21 and 22, and inserted in the right-hand end face of the projection 6 and in the side face of the leg section 18b. As a result, the hinge shaft 23 is located horizontally along the length of the housing 4 and the display housing 15.

One end of the hinge shaft 23 is pivotably coupled to the first bracket 21, and the other end is secured to the second bracket 22. A friction-type brake mechanism 24 using, for example, a waved washer is mounted on a connection between the hinge shaft 23 and the first bracket 21. The brake mechanism 24 limits the degree of pivoting operation of the hinge shaft 23.

Accordingly, the display unit 3 can pivot in the same direction as that of the pivoting of the hinge shaft 23. Specifically, the display unit 3 is supported by the housing 4 so that it can pivot on the hinge shaft 23 between a closure position in which it is overthrown on the keyboard 5, and an open position in which the keyboard 5 and the display screen are exposed.

Figure 5:
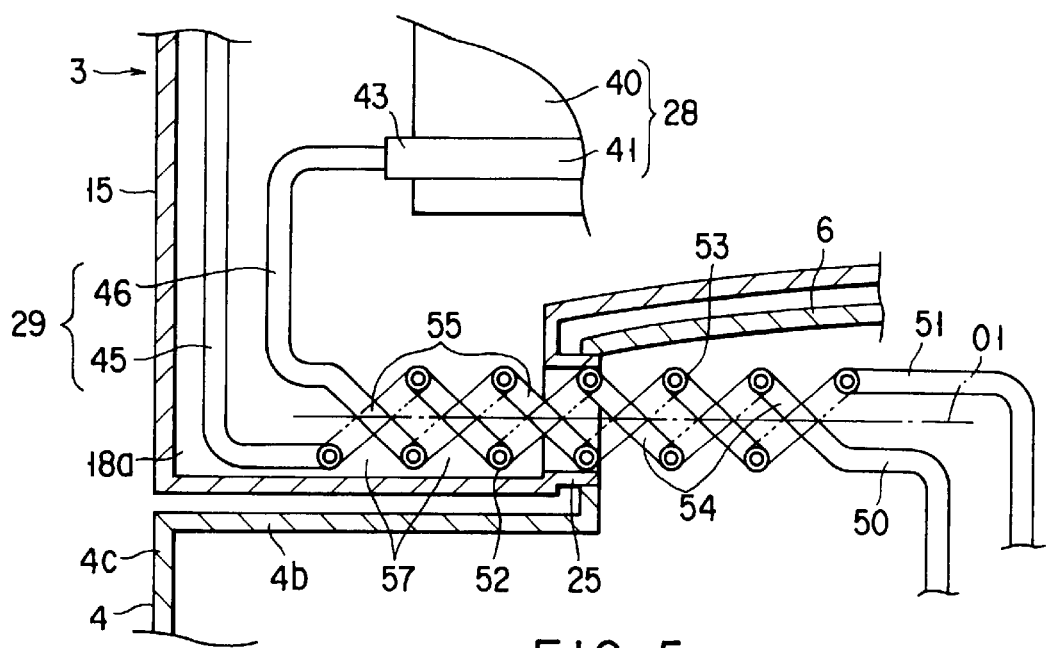
FIG. 5 is an enlarged sectional view illustrating the bending-force-absorbing sections of first and second heat transfer pipes provided between the computer main body and the display housing.

The left-hand leg section 18a located remote from the hinge device 20 has a cylindrical pipe guide 25 as shown in FIG. 5. The pipe guide 25 protrudes from the side face of the leg section 18a into a left portion of the projection 6. Accordingly, the interior of the housing 4 and the interior of the display housing 15 communicate with each other via the pipe guide 25 and the left-hand leg section 18a.

As shown in FIGS. 1 and 2, the portable computer 1 has a liquid-cooling type cooling unit 26 for forcibly cooling the semiconductor package 9. The cooling unit 26 includes a heat receiving head 27 as heat receiving means, a radiator 28 as heat exchanging means, and a circulation line 29 as circulation means.

Figure 4:
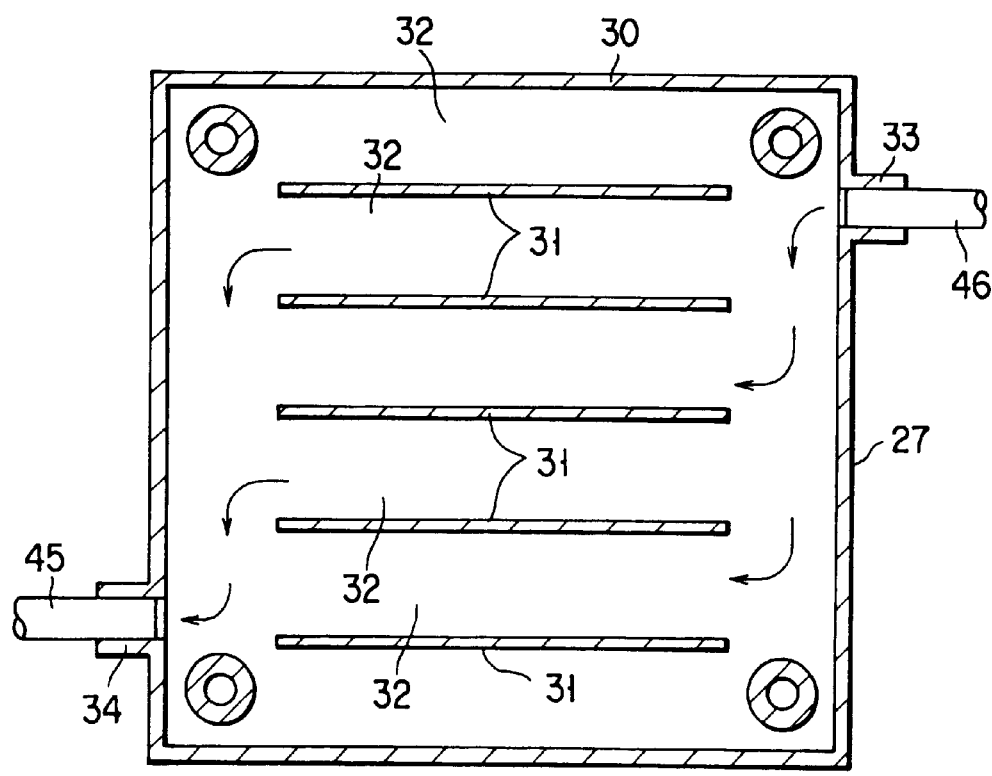
FIG. 4 is a sectional view of the heat receiving head, illustrating the structure of the interior of a heat conduction case.

The heat receiving head 27 has a heat conductive case 30 as shown in FIG. 3 or 4. The heat conductive case 30 is made of a metal having a high thermal conductivity, such as an aluminum alloy. The heat conductive case 30 is in the shape of a flat box and has a larger surface than the semiconductor package 9.

A plurality of guide walls 31 are formed in the heat conductive case 30. The guide walls 31 are parallel to each other and separate from each other, thereby defining a plurality of coolant passages 32 in the heat conductive case 30. The heat conductive case 30 has a coolant inlet 33 and a coolant outlet 34. The coolant inlet 33 is located at the upstream end of the coolant passage 32, while the coolant outlet 34 is located at the downstream end of the coolant passage 32.

The heat receiving head 27 has its four corners fixed to the circuit board 8 by means of respective screws 36. The heat conductive case 30 of the heat receiving head 27 is opposed to the circuit board 8 with the semiconductor package 9 interposed therebetween. A heat conductive sheet 37 is provided between the heat conductive case 30 and the IC chip 11 of the semiconductor package 9. The heat conductive case 30 is pressed against the IC chip 11 by a plate spring 38, with the heat conductive sheet 37 held therebetween. Thus, the heat conductive case 30 is thermally connected to the IC chip 11 via the heat conductive sheet 37.

As shown in FIG. 2, the radiator 28 includes a radiator plate 40 and a radiator pipe 41. The radiator plate 40 is made of a metal having a high heat conductivity, such as an aluminum alloy. The radiator plate 40 is fixed to the inner surface of the display housing 15 behind the liquid crystal display panel 16 by means of screws or an adhesive. Thus, the radiator plate 40 is thermally connected to the display housing 15.

The radiator pipe 41 is made of a metal having a high heat conductivity, such as an aluminum alloy or a copper-based metal, and is bent in a zigzag manner. The radiator pipe 41 is fixed to the surface of the radiator plate 40 by means of an adhesive or solder. Thus, the radiator plate 40 and the radiator pipe 41 are thermally connected to each other. The radiator pipe 41 has a coolant inlet 42 and a coolant outlet 43. The coolant inlet and outlet 42 and 43 are located at left-hand portions of the display housing 15, vertically separate from each other.

The circulation line 29 includes first and second heat transfer pipes 45 and 46 that are formed of metal pipes having a diameter of, for example, 2–3 mm. The first heat transfer pipe 45 connects the coolant outlet 34 of the heat receiving head 27 to the coolant inlet 42 of the radiator pipe 41. The first heat transfer pipe 45 extends through the inside of the housing 4 to a left-hand portion of the projection 6, and extends up to a left-hand portion of the inside of the display housing 15 through the pipe guide 25 and the left-hand leg section 18a. The second heat transfer pipe 46 connects the coolant inlet 33 of the heat receiving head 27 to the coolant outlet 43 of the radiator pipe 41. The second heat transfer pipe 46 extends through the inside of the housing 4 to a left-hand portion of the projection 6, and extends up to a left-hand portion of the inside of the display housing 15 through the pipe guide 25 and the left-hand leg section 18a.

Thus, the coolant passage 32 of the heat receiving head 27 is connected to the radiator pipe 41 via the first and second heat transfer pipes 45 and 46. The coolant passage 32, the radiator pipe 41 and the first and second heat transfer pipes 45 and 46 airtightly contain a liquid coolant (cooling medium) such as water or fluorocarbon.

A pump 47 is provided across the second heat transfer pipe 46 in the housing 4. The coolant fed from the pump 47 is first guided to the heat receiving head 27, where it flows through the coolant passage 32. The coolant is then guided to the radiator pipe 41 from the coolant passage 32 through the first heat transfer pipe 45. After passing through the radiator pipe 41, the coolant is returned to the pump 47 via the second heat transfer pipe 46. Thus, the coolant is forcibly circulated between the heat receiving head 27 and the radiator pipe 41.

Figure 6:
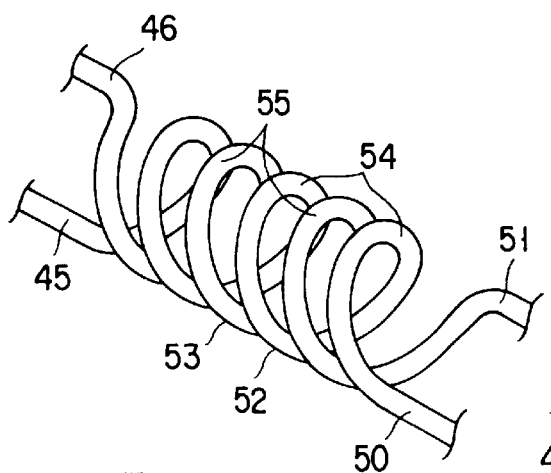
FIG. 6 is a perspective view illustrating a state in which the bending-force-absorbing sections of the first and second heat transfer pipes are engaged with each other.
Figure 7:
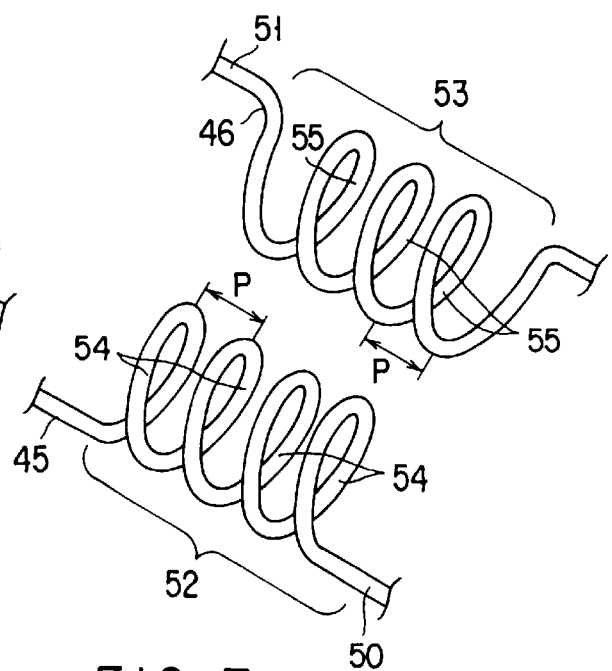
FIG. 7 is a perspective view illustrating each of the bending-force-absorbing sections of the first and second heat transfer pipes.

As shown in FIGS. 2 and 5, the first and second heat transfer pipes 45 and 46 have intermediate section 50 and 51, respectively. The intermediate sections 50 and 51 extend between the projection 6 of the housing 4 and the leg section 18a of the display housing 15 along an extended line O1 of the axis of the hinge shaft 23. The intermediate sections 50 and 51 include bending-force-absorbing sections 52 and 53 as shown in FIGS. 6 and 7, respectively. The bending-force-absorbing sections 52 and 53 have a plurality of loops 54 and 55, respectively. The loops 54 and 55 are formed by winding the first and second heat transfer pipes 45 and 46 along the extended line O1 of the axis of the hinge shaft 23, respectively. The loops 54 (the loops 55) are arranged with a predetermined pitch P.

As is best shown in FIG. 6, the bending-force-absorbing sections 52 and 53 of the first and second heat transfer pipes 45 and 46 are arranged coaxially, and the loops 54 and 55 are engaged with each other. More specifically, where the bending-force-absorbing sections 52 and 53 are engaged, the loops 54 of the bending-force-absorbing section 52 are interleaved with the loops 55 of the bending-force-absorbing section 53. The bending-force-absorbing sections 52 and 53 are arranged coaxially with the hinge shaft 23. The adjacent loops 54 and 55 are separate from each other in the axial direction of the hinge shaft 23, and a heat insulating space 57 is defined between each pair of adjacent loops 54 and 55.

As shown in FIG. 5, the bending-force-absorbing sections 52 and 53 extend through the pipe guide 25. One end of each of the bending-force-absorbing sections 52 and 53 is situated inside the projection 6. The other end of each of the bending-force-absorbing sections 52 and 53 is situated inside the leg section 18a of the display housing 15. Thus, the bending-force-absorbing sections 52 and 53 are arranged horizontally at a connection of the housing 4 and the display housing 15.

In the portable computer 1 constructed as above, when the semiconductor package 9 is made to execute complicated processing, the IC chip 11 generates heat. The heat of the IC chip 11 is transferred to the heat conductive case 30 of the heat receiving head 27 via the heat conductive sheet 37. Since the heat conductive case 30 has the coolant passage 32 through which the coolant flows, the heat of the IC chip 11 transferred to the heat conductive case 30 is further transferred to the coolant. The resultant heated coolant is guided to the radiator 28 in the display unit 3 via the first heat transfer pipe 45. As a result, the heat of the IC chip 11 is transferred to the radiator 28 by way of the coolant.

The coolant guided to the radiator 28 flows through the long radiator pipe 41 bent in a zigzag manner. During the process of flowing, the heat absorbed by the coolant is transferred from the radiator pipe 41 to the radiator plate 40, and diffused thereon. Since the radiator plate 40 is thermally connected to the heat conductive display housing 15, the heat transferred to the radiator plate 40 is diffused to the surface of the display housing 15 and then to the atmosphere.

The coolant is cooled as a result of heat exchange while it is flowing through the radiator pipe 41. The cooled coolant is guided to the pump 47 via the second heat transfer pipe 46. After the coolant is pressurized by the pump 47, it is returned to the coolant passage 32 of the heat receiving head 27, where it again absorbs the heat of the IC chip 11.

In the above structure, the circulation of the coolant between the heat receiving head 27 of the housing 4 and the radiator 28 of the display unit 3 enables the heat of the semiconductor package 9 to be efficiently transferred to the display unit 3 and discharged to the atmosphere therefrom. Accordingly, as compared to the conventional forcible air cooling, the heat radiation performance of the semiconductor package 9 can be enhanced, and hence an increase in the amount of heat generated from the package can be coped with effectively.

Further, in the portable computer 1 constructed as above, the display unit 3 containing the radiator 28 is arranged so that it can pivot on the hinge shaft 23 between the closure position and the open position. When the display unit 3 is pivoted from the closure position to the open position, or vice versa, a bending force is applied to the intermediate sections 50 and 51 of the first and second heat transfer pipes 45 and 46 extending at the connection of the housing 4 and the display housing 15.

As described above, the intermediate sections 50 and 51 of the first and second heat transfer pipes 45 and 46 have the coiled bending-force-absorbing sections 52 and 53 coaxial with the hinge shaft 23.

Accordingly, if a bending force is applied to the bending-force-absorbing sections 52 and 53 when the display unit 3 is pivoted, the loops 54 and 55 of the bending-force-absorbing sections 52 and 53 smoothly deform in a direction in which the loops are tightly wound, or in a direction in which they are loosely wound, thereby absorbing the bending force. As a result, concentration of stress on a particular portion of the first or second heat transfer pipe 45 or 46 is avoided, whereby the stress on the pipes can be reduced to an allowable value.

Thus, irrespective of the pivoting operation of the display unit 3 that contains the radiator 28, the first and second heat transfer pipes 45 and 46 can be prevented from being damaged, and hence leakage of the coolant due to the damage can be avoided.

Moreover, the bending-force-absorbing sections 52 and 53 of the first and second heat transfer pipes 45 and 46 are arranged coaxially so that they can be engaged with each other. Accordingly, the bending-force-absorbing sections 52 and 53 can be provided at one location without being separated. In other words, the bending-force-absorbing sections 52 and 53 can be formed compact at middle portions of the first and second heat transfer pipes 45 and 46.

In light of the above, it is not necessary to secure a wide space for individually containing the bending-force-absorbing sections 52 and 53. Accordingly, the bending-force-absorbing sections 52 and 53 can be provided easily.

In addition, the spaces 57 defined between adjacent loops 54 and 55 for heat insulation can thermally isolate the bending-force-absorbing section 52 for flowing heated coolant, from the bending-force-absorbing section 53 for flowing cooled coolant. Thus, undesirable heat exchange between the adjacent bending-force-absorbing sections 52 and 53 can be avoided, thereby enhancing the efficiency of heat transfer from the heat receiving head 27 to the radiator 28.

Figure 8:
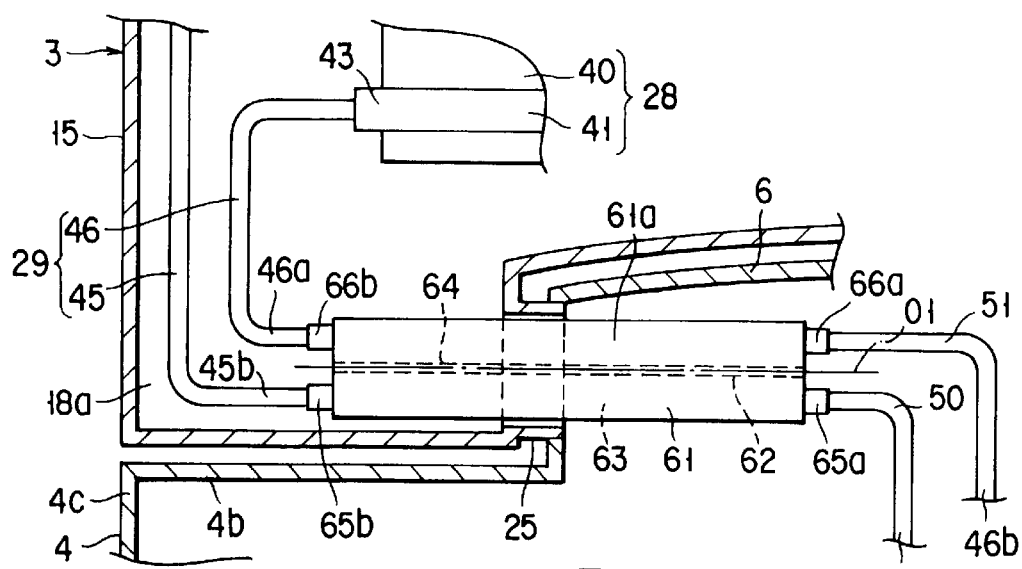
FIG. 8 is an enlarged sectional view illustrating the bending-force-absorbing sections of first and second heat transfer pipes provided between a computer main body and a display housing, which are incorporated in a portable computer according to a second embodiment of the invention.
Figure 9:
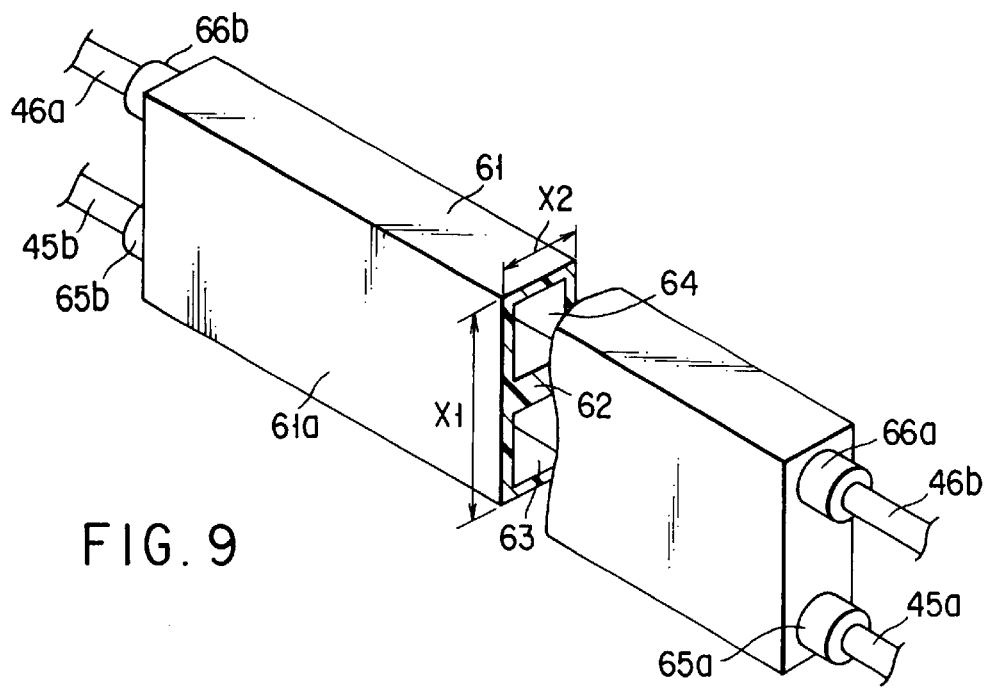
FIG. 9 is a perspective view illustrating the bending-force-absorbing sections of the first and second heat transfer pipes.

The present invention is not limited to the above-described first embodiment. Referring now to FIGS. 8 and 9, a second embodiment of the invention will be described.

The second embodiment differs from the first embodiment only in the structure for absorbing the bending force applied to the first and second heat transfer pipes 45 and 46. Since the other basic structures of the portable computer 1 and the cooling unit 26 are similar between the first and second embodiments, structural elements in the second embodiment similar to those in the first embodiment are denoted by corresponding reference numerals, and no description will be given thereof.

As shown in FIG. 8, the first and second heat transfer pipes 45 and 46 have a common bending-force-absorbing section 61 at their respective intermediate sections 50 and 51. The bending-force-absorbing section 61 includes a flat box-shaped section 61a extending coaxially with the hinge shaft 23. The box-shaped section 61a is made of, for example, a synthetic resin material having a heat resistance, and has an elongated cross section with long side X1 and short side X2. The box-shaped section 61a is situated coaxially with the hinge shaft 23, and has elasticity so that it can be twisted about the extended line O1. The box-shaped section 61a is inserted through the pipe guide 25 of the display housing 15, and situated horizontally at a connection of the leg section 18a of the display housing 15 and the housing 4.

The interior of the box-shaped section 61a is divided into first and second passages 63 and 64 by means of a partition wall 62. The passages 63 and 64 are arranged along the long side X1. The first passage 63 has connection ports 65a and 65b provided at its opposite ends that are located in its longitudinal direction. The connection port 65a is connected to an upstream portion 45a of the first heat transfer pipe 45, while the other connection port 65b is connected to a downstream portion 45b of the first heat transfer pipe 45. The second passage 64 has connection ports 66a and 66b provided at its opposite ends that are located in its longitudinal direction. The connection port 66a is connected to a downstream portion 46b of the second heat transfer pipe 46, while the other connection port 66b is connected to an upstream portion 46a of the second heat transfer pipe 46.

Thus, the first passage 63 constitutes a part of the first heat transfer pipe 45 and allows the flow of coolant from the heat receiving head 27 to the radiator 28. Similarly, the second passage 64 constitutes a part of the second heat transfer pipe 46 and allows the flow of coolant from the radiator 28 to the pump 47.

In the above structure, the bending-force-absorbing section 61 coaxial with the hinge shaft 23 has the hollow, elastically deformable box-shaped section 61a. Since the box-shaped section 61a extends coaxially with the hinge shaft 23, it can easily twist about the extended line O1 of the axis of the hinge shaft 23. Accordingly, when a bending force has been applied to the bending-force-absorbing section 61 while the display unit 3 is being pivoted, the box-shaped section 61a smoothly twists in a direction in which the display unit 3 pivots, thereby absorbing the bending force applied to the bending-force-absorbing section 61.

As a result, concentration of stress on a particular portion of the first or second heat transfer pipe 45 or 46 is avoided, whereby the stress on the pipes can be reduced to an allowable value.

Moreover, in the above structure, since the first passage 63 for flowing coolant heated by heat conducted from the heat receiving head 27, and the second passage 64 for flowing coolant cooled by the radiator 28 are arranged in parallel in the single box-shaped section 61a, it is sufficient if the bending-force-absorbing section 61 is located at one portion of the circulation line 29. Since thus, the bending-force-absorbing section 61 occupies only a small portion of the circulation line 29, it is not necessary to secure a wide space for containing the bending-force-absorbing section 61 in the housing 4 or the display housing 15.

Figure 10:
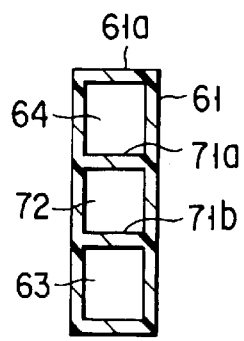
FIG. 10 is a sectional view of the bending-force-absorbing sections of first and second heat transfer pipes employed in a third embodiment of the invention.

Referring then to FIG. 10, a third embodiment of the invention will be described.

The third embodiment is a modification of the second embodiment. In the third embodiment, the interior of the box-shaped section 61a is divided into three chambers, i.e. a first passage 63, a second passage 64 and an air chamber 72 by a pair of partition walls 71a and 71b. The air chamber 72 is independent of the first and second passages 63 and 64, and serves as a heat insulating space. The air chamber 72 is situated between the first and second passages 63 and 64. In other words, the first and second passages 63 and 64 are located in parallel with each other, with the air chamber 72 interposed therebetween.

In the above-described structure, since the air chamber 72 exists between the first and second passages 63 and 64, these passages are thermally isolated. This structure prevents undesirable heat exchange between the passages 63 and 64, although the first passage 63 for flowing heated coolant and the second passage 64 for flowing cooled coolant are situated in the single box-shaped section 61a.

As a result, the efficiency of heat transfer from the heat receiving head 27 to the radiator 28 can be enhanced, and the heat radiation performance of the semiconductor package 9 can be maintained at high level.

Figure 11:
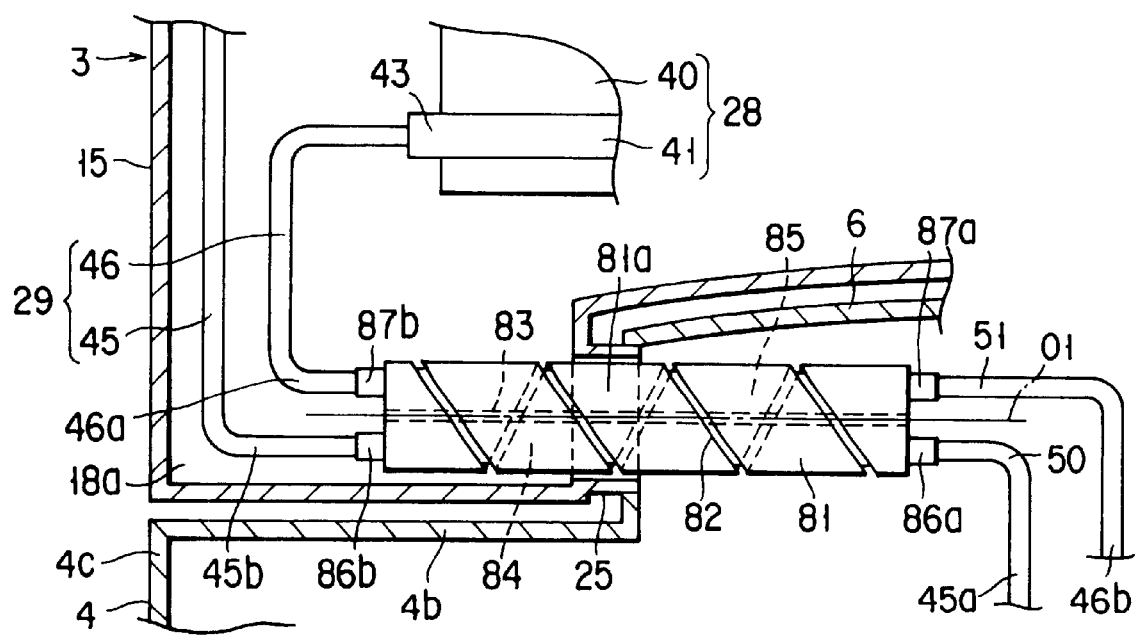
FIG. 11 is an enlarged sectional view illustrating the bending-force-absorbing sections of first and second heat transfer pipes provided between a computer main body and a display housing, which are incorporated in a portable computer according to a fourth embodiment of the invention.
Figure 12:
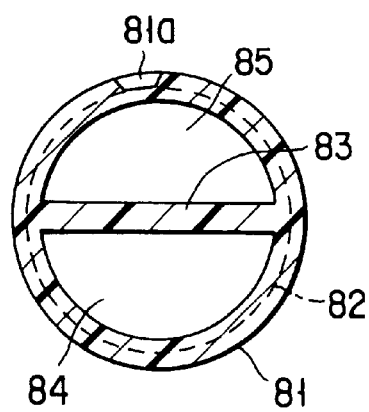
FIG. 12 is a sectional view of the bending-force-absorbing sections of the first and second heat transfer pipes employed in the fourth embodiment of the invention.

FIGS. 11 and 12 illustrate a fourth embodiment of the invention.

The fourth embodiment differs from the first embodiment only in the structure for absorbing the bending force applied to the first and second heat transfer pipes 45 and 46. Since the other basic structures of the portable computer 1 and the cooling unit 26 are similar between the first and second embodiments, structural elements in the fourth embodiment similar to those in the first embodiment are denoted by corresponding reference numerals, and no description will be given thereof.

As shown in FIG. 11, the first and second heat transfer pipes 45 and 46 have a common bending-force-absorbing section 81 at their respective intermediate sections 50 and 51. The bending-force-absorbing section 81 includes a hollow cylindrical section 81a extending coaxially with the hinge shaft 23.

The cylindrical section 81a is made of, for example, an elastic synthetic resin material having a heat resistance, and situated along the extended line O1 of the axis of the hinge shaft 23. A helical groove 82 as a guide section is formed in the outer peripheral surface of the cylindrical section 81a. The groove 82 enables the elastic cylindrical section 81 to be easily twisted about the extended line O1 of the axis of the hinge shaft 23. The cylindrical section 81a is inserted through the pipe guide 25 of the display housing 15, and located horizontally at a connection of the leg section 18a of the display housing 15 and the housing 4.

The interior of the cylindrical section 81a is divided into first and second passages 84 and 85 by means of a partition wall 83. The passages 84 and 85 are arranged radially in the cylindrical section 81a. The first passage 84 has connection ports 86a and 86b provided at its opposite ends that are located in its longitudinal direction. The connection port 86a is connected to an upstream portion 45a of the first heat transfer pipe 45, while the other connection port 86b is connected to a downstream portion 45b of the first heat transfer pipe 45. The second passage 85 has connection ports 87a and 87b provided at its opposite ends that are located in its longitudinal direction. The connection port 87a is connected to a downstream portion 46b of the second heat transfer pipe 46, while the other connection port 87b is connected to an upstream portion 46a of the second heat transfer pipe 46.

Thus, the first passage 84 constitutes a part of the first heat transfer pipe 45 and allows the flow of coolant from the heat receiving head 27 to the radiator 28. Similarly, the second passage 85 constitutes a part of the second heat transfer pipe 46 and allows the flow of coolant from the radiator 28 to the pump 47.

In the above structure, the bending-force-absorbing section 81 coaxial with the hinge shaft 23 has the elastically deformable cylindrical section 81a. Since the cylindrical section 81a has the helical groove 82 formed in its outer peripheral surface, it can easily twist along the groove 82.

Therefore, when a bending force has been applied to the bending-force-absorbing section 81 while the display unit 3 is being pivoted, the cylindrical section 81a smoothly twists in a direction in which the display unit 3 pivots, thereby absorbing the bending force applied to the bending-force-absorbing section 81.

As a result, concentration of stress on a particular portion of the first or second heat transfer pipe 45 or 46 is avoided, whereby the stress on the pipes can be reduced to an allowable value.

Moreover, in the above structure, since the first passage 84 for flowing coolant heated by the heat conducted from the heat receiving head 27, and the second passage 85 for flowing coolant cooled by the radiator 28 are arranged in parallel in the single cylindrical section 81a, it is sufficient if the bending-force-absorbing section 81 is located at one portion of the circulation line 29. Since thus, the bending-force-absorbing section 81 occupies only a small portion of the circulation line 29, it is not necessary to secure a wide space for containing the bending-force-absorbing section 81 in the housing 4 or the display housing 15.

Although, in the fourth embodiment, the helical groove 82 is formed in the outer peripheral surface of the cylindrical section 81a to facilitate the twisting of the bending-force-absorbing section 81, a helical projection may be formed in place of the groove 82.

Furthermore, the coolant circulated between the heat receiving head 27 and the radiator 28 is not limited to a liquid, but may be a gas such as air or helium gas.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A cooling unit for use in an electronic apparatus including a main body and a display unit pivotably supported by the main body using a hinge shaft, the main body having a heat generating component and a projection, the display unit having a leg adjacent to the projection, comprising:

a heat receiving section provided in the main body and thermally connected to the heat generating component;

a heat exchange section provided in the display unit; and a circulation line which circulates a cooling medium between the heat receiving section and the heat exchange section, the circulation line including an absorbing section having a shape that is deformable to twist about an axis of the hinge shaft when the display unit is pivoted, the absorbing section extending through the projection of the main body and the leg of the display unit.

2. The cooling unit according to claim 1, wherein the circulation line includes a first heat transfer pipe for guiding, to the heat exchange section, cooling medium heated by heat conducted from the heat receiving section, and a second heat transfer pipe for guiding, to the heat receiving section, cooling medium cooled by the heat exchange section, the first and second heat transfer pipes having a plurality of loops formed by coiling the first and second heat transfer pipes about the axis of the hinge shaft at locations corresponding to the absorbing section.

3. The cooling unit according to claim 1, wherein the absorbing section of the circulation line is a deformable member extending along the axis of the hinge shaft, the absorbing section having a first passage for flowing the cooling medium heated by heat conducted from the heat receiving section, and a second passage for flowing the cooling medium cooled by the heat exchange section.

4. The cooling unit according to claim 2, wherein each of the loops of the first heat transfer pipe is adjacent to a corresponding one of the loops of the second heat transfer pipe with a space interposed therebetween for heat insulation.

5. The cooling unit according to claim 3, wherein the absorbing section has an elongated box-shaped section of a cross section having a long side and a short side, and the first and second passages are arranged adjacent to each other along the long side.

6. The cooling unit according to claim 3, wherein the first and second passages are arranged adjacent to each other with a heat insulating space interposed therebetween.

7. The cooling unit according to claim 3, wherein the absorbing section has an elastically deformable cylindrical section, the cylindrical section having a helical guide section provided at an outer peripheral surface thereof.

8. An electronic apparatus comprising:

a main body having a heat generating component and a projection;

a display unit pivotably supported by the main body using a hinge shaft, the display unit having a leg adjacent to the projection;

a heat receiving section provided in the main body and thermally connected to the heat generating component;

a heat exchange section provided in the display unit; and a circulation line which circulates a cooling medium between the heat receiving section and the heat exchange section, the circulation line including an absorbing section having a shape that is deformable to twist about an axis of the hinge shaft when the display unit is pivoted, the absorbing section extending through the projection of the main body and the leg of the display unit.

9. The electronic apparatus according to claim 8, wherein the circulation line includes a pump for forcibly circulating the cooling medium.

10. The electronic apparatus according to claim 8, wherein the display unit has a heat conductive display housing thermally connected to the heat exchange section.

11. The electronic apparatus according to claim 8, wherein the leg of the display unit communicates with an interior of the projection via a cylindrical guide, the absorbing section of the circulation line extending through the guide.

12. The electronic apparatus according to claim 10, wherein the heat receiving section includes a heat conductive case for receiving heat generated by the heat generating component, the heat conductive case having a passage for flowing cooling medium, and the heat exchange section having a heat radiation pipe thermally connected to the display housing.

13. The electronic apparatus according to claim 11, wherein the guide is located coaxially with the hinge shaft.

14. An electronic apparatus comprising:

a main body having a heat generating component and a projection;

a display unit pivotably supported by the main body using a hinge shaft, the display unit having a leg adjacent to the projection;

a heat receiving section provided in the main body and thermally connected to the heat generating component;

a heat exchange section provided in the display unit; and a circulation line which circulates a cooling medium between the heat receiving section and the heat exchange section, the circulation line having a housing extending through the projection of the main body and the leg of the display unit, the housing including a first passage for guiding, to the heat exchange section, a cooling medium heated by heat conducted from heat receiving section, and a second passage for guiding, to the heat receiving section, the cooling medium cooled by the heat exchange section, the first and second passages being deformed when the display unit has pivoted, thereby absorbing stress occurring in the circulation line.

15. The electronic apparatus according to claim 14, wherein the first and second passages are arranged adjacent to each other with a heat insulating space interposed therebetween.

16. The electronic apparatus according to claim 14, wherein the housing being a cylindrical member extending along an axis of the hinge shaft, the housing having a helical guide section provided at an outer peripheral surface thereof.

17. A cooling unit for use in an electronic apparatus including a main body and a display unit pivotably supported by the main body using a hinge shaft, the main body having a heat generating component and a projection, the display unit having a leg adjacent to the projection, comprising:

a heat receiving section provided in the main body and thermally connected to the heat generating component;

a heat exchange section provided in the display unit; and a circulation line circulating a cooling medium between the heat receiving section and the heat exchange section, the circulation line including a deformable section having a shape that is deformable to twist about an axis of the hinge shaft when the display unit is pivoted, the deformable section including a first passage for guiding, to the heat exchange section, a cooling medium heated by heat conducted from heat receiving section, and a second passage for guiding, to the heat receiving section, the cooling medium cooled by the heat exchange section, the deformable section extending through the projection of the main body and the leg of the display unit.

18. A cooling unit for use in an electronic apparatus including a main body and a display unit pivotably supported by the main body using a hinge shaft, the main body having a heat generating component and a projection, the display unit having a leg adjacent to the projection, comprising:

a heat receiving section provided in the main body and thermally connected to the heat generating component;

a heat exchange section provided in the display unit;

a circulation line circulating a cooling medium between the heat receiving section and the heat exchange section, the circulation line including a deformable section having a shape that is deformable to twist about an axis of the hinge shaft when the display unit is pivoted, the deformable section extending through the projection of the main body and the leg of the display unit; and a pump provided across the circulation line, the pump forcibly circulating the cooling medium between the heat receiving section and the heat exchange section.

19. A cooling unit for use in an electronic apparatus including a main body and a display unit pivotably supported by the main body using a hinge shaft, the main body having a heat generating component and a projection, the display unit having a leg adjacent to the projection, comprising:

a heat receiving section provided in the main body and thermally connected to the heat generating component;

a heat exchange section provided in the display unit; and a circulation line for circulating a cooling medium between the heat receiving section and the heat exchange section, the circulation line having a housing extending through the projection of the main body and the leg of the display unit, the housing including a first passage for guiding, to the heat exchange section, the cooling medium heated by heat conducted from heat receiving section, and a second passage for guiding, to the heat receiving section, the cooling medium cooled by the heat exchange section, the first and second passages being deformed when the display unit is pivoted, thereby absorbing stress occurring in the circulation line.

* * * * *